United States Patent [19]

Pelgrom

[11] Patent Number: 4,905,006
[45] Date of Patent: Feb. 27, 1990

[54] DIGITAL-TO-ANALOG CONVERTER

[75] Inventor: Marcellinus J. M. Pelgrom, Eindhoven, Netherlands

[73] Assignee: U.S. Philips Corporation, New York, N.Y.

[21] Appl. No.: 178,049

[22] Filed: Apr. 5, 1988

[30] Foreign Application Priority Data

Apr. 27, 1987 [NL] Netherlands .......................... 8700982

[51] Int. Cl.$^4$ .............................................. H03M 1/76
[52] U.S. Cl. .................................... 341/150; 341/141; 341/146
[58] Field of Search ................. 341/133, 141, 146, 150

[56] References Cited

U.S. PATENT DOCUMENTS

| 4,517,551 | 5/1985 | Cambell, Jr. ........................ | 341/150 |
| 4,661,802 | 4/1987 | Yukawa .............................. | 341/150 |
| 4,763,108 | 8/1988 | Kobayashi .......................... | 341/150 |

FOREIGN PATENT DOCUMENTS 59-8427  1/1984  Japan .

Primary Examiner—William M. Shoop, Jr.
Assistant Examiner—Gary Romano
Attorney, Agent, or Firm—Bernard Franzblau

[57] ABSTRACT

A digital-to-analog converter for converting a digital signal having a word length n into an analog signal comprises a series arrangement of at least two integrating circuits (1,2) and a control unit (18) for supplying a first and a second control signal (S1, S2) to the first and the second integrating circuit. The integrating circuits are adapted to perform an integration step under the influence of the first and the second control signal. The control unit is adapted to generate, in this order, the first control signal M1 times, the second control signal M2 times, the first control signal M3 times and the second control signal M4 times. For converting arbitrary digital signals M2+M4 is equal to a constant (k). Due to this measure an offset voltage which is independent of the value of the n-bit digital signal to be converted is produced at the output (8) of the converter. For converting n-bit digital signal the constant k is preferably taken to be equal to $2^p$ in which $p \leq n$.

17 Claims, 4 Drawing Sheets

DIGITAL-TO-ANALOG CONVERTER

BACKGROUND OF THE INVENTION

This invention relates to a digital-to-analog converter for converting a digital signal having a word length n into an analog signal, comprising a series arrangement of a first and a second integrating circuit each having an input and an output and a control signal input, the output of the first integrating circuit being coupled to the input of the second integrating circuit, a control unit for supplying a first and a second control signal at a first and a second output, respectively, coupled to the control signal input of the first and the second integrating circuit, respectively, for applying the first and the second control signal to the first and the second integrating circuit, respectively, the first and the second integrating circuit being adapted to perform an integration step under the influence of the first and the second control signal and the control unit being adapted to generate, in this order, the first control signal M1 times, the second control signal M2 times, the first control signal M3 times and the second control signal M4 times.

A digital-to-analog converter to this type is known from the published Japanese Patent Application (kokai) No. 59-8427 and is intended to convert an n-bit digital signal into an analog signal. The integrating circuits in the known converter are in the form of analog integrators. However, it is alternatively possible to form the integrating circuits as (analog) summation devices, charge-coupled devices (CCDs) or switched capacitor integrators.

The known converter is intended to convert 16-bit digital signals into analog signals and it operates as follows. In the first integrating circuit a first value is derived under the influence of M1 times the first control signal, which value is proportional to $2^8 V_{ref}$, in which $V_{ref}$ is a reference value. Subsequently, an analog signal is derived in the second integrating circuit under the influence of M2 times the second control signal, which analog signal is proportional to $MSB \cdot 2^8 V_{ref}$, in which MSB is equal to the value of the binary number of the eight most significant bits of the 16-bit digital signal. Subsequently the output of the first integrating circuit is brought to an initial level (reset to zero in this case) under the influence of a reset signal of the control unit. Subsequently a second value is derived in the first integrating circuit under the influence of M3 times the first control signal, which value is proportional to $V_{ref}$. Then an analog signal is derived in the second integrating circuit under the influence of M4 times the second control signal, which analog signal is proportional to $MSB \cdot 2^8 V_{ref} + LSB \cdot V_{ref}$, in which LSB is equal to the value of the binary number of the eight least significant bits of the 16-bit digital signal. The known converter appears to have a disturbing offset component in the analog output signal.

SUMMARY OF THE INVENTION

It is an object of the invention to provide a digital-to-analog converter which does not have (substantially) any disturbing offset component in the analog output signal. To this end the digital-to-analog converter according to the invention is characterized in that M2+M4 is equal to a constant (k) for converting arbitrary digital signals having a word length n. For converting an n-bit digital signal this constant (k) is preferably chosen to be equal to $2^p$, in which $P \leq n$.

Thus, the invention is not limited to use in digital-to-analog converters for converting binary (digital) signals having a word length n. The invention can also be used in digital-to-analog converters for converting digital signals having a word length n which may be associated with numerical systems other than the binary system. For example, ternary or quaternary numerical systems are feasible.

The invention is based on the following recognition. The known converter appears to generate an offset at its output which is signal-dependent. This means that the offset for different values of the n-bit digital signal has a different magnitude. It can be calculated that the offset at the output of the converter, in so far as its results from an offset $V_o$ at the output of the first integrating circuit, is equal to $(MSB+LSB) \cdot V_o$ This means, for example, for a 16-bit digital signal for which it holds that MSB=0 and LSB=255 (decimal), that the offset is equal to 255 $V_o$. However, for the 16-bit digital signal which is larger by the value of 1, i.e. MSB=1 and LSB=0, this means that the offset is equal to $V_o$.

The measure according to the invention is based on the recognition that the two integrating circuits are controlled in such a way that a signal-independent offset is generated at the output of the converter. This means that an offset voltage is produced at the output of the converter, but the magnitude of this offset voltage is independent of the value of the digital signal. For this fixed offset voltage, whose magnitude can of course be determined in a simple manner, a compensation, if required, can be easily realized at a later stage. Since the second integrating circuit according to the invention initially receives a second control signal M2 times and at a later stage M4 times, in which M2+M4 is equal to a constant k, an offset voltage which is equal to $(M2+M4) \cdot V_o$, i.e. equal to $k \cdot V_o$ is generated at the output of the converter. The offset voltage thus has a given constant value, irrespective of the digital signal to be converted.

For converting an n-bit digital signal the digital-to-analog converter may be further characterized in the M3=1, in that M4 is the value corresponding to the binary number formed by the p least significant bits of the n-bit digital signal and in that M1 is the value corresponding to the binary number formed by the n-p most significant bits of the n-bit digital signal. In contrast to the control method used in the known converter, in which the first integrating circuit generates a fixed value twice (namely the afore-mentioned first and second value) and in which only the second integrating circuit is controlled by control signals derived from the value of the n-bit digital signal, signals which are dependent on the value of the digital signal to be converted in all four integration steps are derived in both the first and the second integrating circuit in the converter according to the invention. Thus, it holds for the first integration step that M1 is equal to the previously mentioned value MSB, M2=k−M4 for the second integration step, M3=1 for the third integration step (which means that after two integration steps in the first integrating circuit an output signal is present at its output which is equal to (M1+1).Vref, i.e. (MSB+1).Vref, which signal is thus also dependent on the value of the n-bit digital signal), and M4 is equal to the previously mentioned value LSB for the fourth integration step.

The digital-to-analog converter may be further characterized in that a third integrating circuit is arranged in series with the second integrating circuit, in that the third integrating circuit is adapted to perform an integration step under the influence of a third control signal applied to a control signal input of said third integrating circuit, in that the control unit is adapted to generate the third control signal at a third output which is coupled to the control signal input of the third integrating circuit and is also adapted to generate a reset signal for bringing the signal at the output of the first integrating circuit to an initial level and for generating, in this order, the first control signal M5 times, the third control signal M6 times, the second control signal M7 times and the third control signal M8 times. If it holds the M6+M8 is equal to a constant (k'), for example, equal to $2^q$ in which $p+q \leq n$, for converting arbitrary n-bit digital signals, an offset is produced at the output of the third integrating circuit which is also more or less constant and is more or less independent of the value of the n-bit digital signal. Moreover, the maximum required number of clock pulses for converting an n-bit digital signal in this embodiment is smaller than in the two-stage design, provided that n is not too small. For n which is divisible by 2 and by 3 and for $p=q=n/3$, this number is approximately $3.2^{n/3}$ as against $2.2^{n/2}$ in the two-stage converter if it holds that $p=n/2$. Thus, this means that for $n>6$ the three-stage converter is faster than the two-stage converter.

It is of course evident that the converter according to the invention may be further extended by arranging at least a fourth integrating circuit in series with the third integrating circuit.

For converting an n-bit digital signal, the digital-to-analog converter may be further characterized in the $M3=M5=M7=1$, in that M8 is the value corresponding to the binary number constituted by the q least significant bits of the n-bit digital signal, M1 is the value corresponding to the binary number constituted by the n-p-q most significant bits and M4 is the value corresponding to the binary number constituted by the remaining p bits of the n-bit digital signal. The n-bit digital signal to be converter has now been split up into three parts, namely the n-p-q most significant bits constituting the (decimal) number M1 or MSB, the q least significant bits constituting the (decimal) number M8 or LSB and the remaining p bits constituting the (decimal) number M4 or ISB. The first four integration steps in the first and the second integrating circuit are equal to those in the previously described embodiment, with the difference that M1 now corresponds to the n-p-q most significant bits and M2=k-ISB and M4=ISB. After subsequently resetting the first integrating circuit the output signal of the first integrating circuit becomes proportional to M5.Vref, or Vref in the fifth integration step. In the sixth integration step the third integrating circuit is activated M6 (=k'=M8=k'-LSB) times. It may be clear that the sixth integration step can be performed at any moment after the fourth integration step performed by the second integrating circuit. After the sixth integration step the second circuit is activated M7 (=1) times. In the eighth integration step the third circuit is finally activated M8 (=LSB) times. It is clear that the third circuit is activated a fixed number of times k' for an arbitrary digital signal having a word length n. This leads to a more or less constant offset at the output of the third circuit, which offset is more or less independent of the value of the digital signal.

In the two-stage design of the converter p is preferably taken to be equal to n/2 if n is an even number. In this case the number of control signals (or in other words the number of clock cycli) required for converting the digital signal is smallest on average. For the same reason p and q are both preferably taken to be equal to n/3 in the three-stage design of the converter, if n is divisible by 3.

As already described hereinbefore, each integrating circuit may be in the form of a switched capacitor integrator. Such integrators have an amplifier stage with an inverting and a non-inverting input and an output, a capacitor coupled between the inverting input and the output and a capacitor network, comprising at least one switching element, coupled between the input of the integrator and the inverting input of the amplifier stage, said capacitor network having a control signal input for receiving one of the afore-mentioned control signals for causing the switching element to switch under the influence of the control signal. Switched capacitor integrators are known per se and are described extensively in Philips Technisch Tijdschrift Vol. 41 No. 4, pages 109-129. Particularly FIG. 13 in this Article elucidates the different ways in which the capacitor network in such an integrator may be constructed.

To be able to reset to an initial output level, a parallel arrangement of another switching element and the capacitor may be coupled between the inverting input and the output of the amplifier stage of the first integrator, the other switching element having a control signal input for receiving the reset signal.

BRIEF DESCRIPTION OF THE DRAWING

The invention will now be described in greater detail, by way of example, with reference to the accompanying drawings, in which.

DESCRIPTION OF THE PREFERRED EMBODIMENTS

Figure 1:
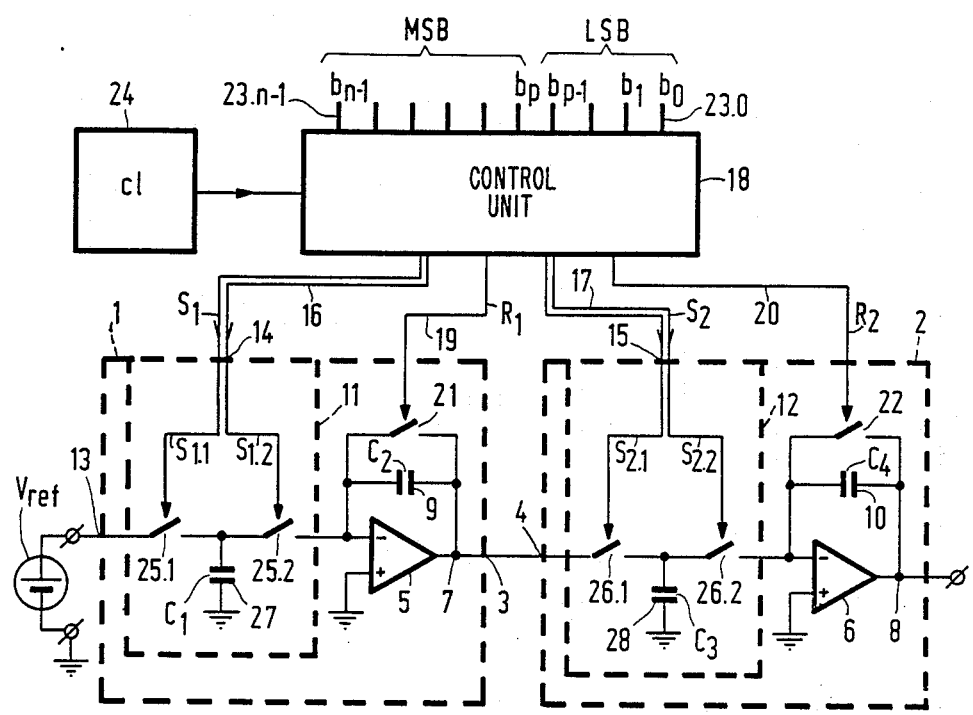
FIG. 1 shows a first embodiment of a converter comprising two integrating circuits.

In the various Figures the same elements are denoted by the same reference numerals.

FIG. 1 shows a digital-to-analog converter comprising a series arrangement of a first and a second integrating circuit 1 and 2, respectively. An output 3 of the first circuit 1 is coupled to an input 4 of the second circuit 2. The circuits 1 and 2 are in the form of switched capacitor integrators and comprise amplifier stages 5 and 6 having inverting (−) and non-inverting (+) inputs and outputs 7 and 8. Capacitors 9 and 10, respectively, are coupled between the inverting input and the output of amplifiers 5 and 6. Capacitor networks 11 and 12 each comprising at least one switching element are being coupled between the inputs 13 and 4, respectively, of the integrator and the inverting input of the respective amplifier stage 5 and 6. The non-inverting inputs (+) of the amplifier stages 5 and 6 are coupled to a point of constant potential (ground). Control signal inputs 14 and 15 of the first and the second integrator constitute a control signal input for the capacitor networks 11 and 12, respectively, and are intended to receive a first control signal S1 and a second control signal S2 which are applied via the leads 16 and 17, respectively, from a control unit 18. First and second reset signals R1 and R2 are applied via leads 19 and 20 from the control unit 18 to switching elements 21 and 22 arranged parallel to the capacitors 9 and 10, respectively. The control unit 18 derives the control signals from the n-bit digital signal which is presented to the control unit via the inputs 23.0 to 23.n-1. The control unit also receives clock pulses from a clock generator 24. The capacitor networks 11 and 12 each comprise a series arrangement of two switching elements 25.1 and 25.2, and 26.1 and 26.2 and capacitors 27 and 28, respectively, arranged between the junction point of these two switching elements and a point of constant potential (ground). The capacitor networks 11 and 12 are rather sensitive to parasitic capacitances, see the description with reference to FIG. 14 in the previously mentioned Philips Technisch Tijdschrift. In practice, another embodiment of these networks will therefore preferably be chosen, for example, one of the networks as shown in FIG. 13 of this Journal. For an explanation of the operation of the embodiment of FIG. 1 use can be made of the less ideal network which is also described in Philips Technisch Tijdschrift, see FIG. 11b.

Figure 2:
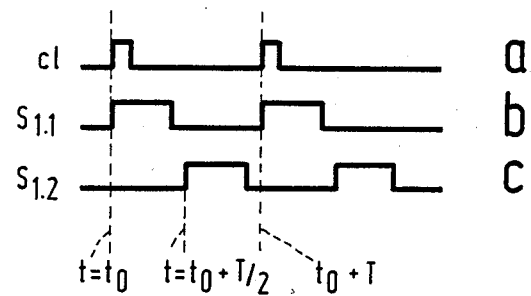
FIG. 2 shows the first control signal supplied by the control unit.

FIG. 2 shows the form of the first control signal S1. The control unit 18 will generate a first control signal under the influence of a clock signal C1 supplied by the clock generator 24. This clock signal is shown as a function of time in FIG. 2a. The period of the clock signal is denoted by T. At instants $t=t_O$ and $t=t_O+T$ the clock generator 24 supplies a clock pulse. At the first clock pulse the control unit 18 supplies a first control signal composed of two parts, namely the signals S1.1 and S1.2 intended to cause the switches 25.1 and 25.2 to switch. These signals S1.1 and S1.2 are shown as a function of time in FIGS. 2b and 2c, respectively. Under the influence of the control signal S1.1 the switch 25.1 is closed for a short period starting at the instant $t_O$. The capacitor 27 is now charged to the voltage Vref which is present at the input 13 of the integrator 1. It is assumed that the capacitor 9 is discharged by a reset signal which is applied via the lead 19 to the switch 21 which is closed for a short period for this purpose. Under the influence of the signal S1.2 the switch 25.2 will subsequently be closed for a short starting period from the instant $t_O+T/2$. Consequently the capacitor 27 is discharged and the capacitor 9 is charged. A voltage which is equal to $$-Vref.C1/C2 = \alpha.Vref$$

is then produced at the output 7, in which C1 and C2 are the capacitances of the capacitors 27 and 9. A clock pulse is supplied again at the instant $t=t_O+T$. Again the signals S1.1 and S1.2 are applied to the network 11 by the control unit. Subsequently a voltage which is equal to $$2.\alpha.Vref.$$

is produced at the output 7. After each subsequent first control signal S1 the output voltage will thus have increased by $\alpha.Vref$. The second control signal S2 applied by the control unit 18 to the network 12 is also composed of two components, namely S2.1 and S2.2 causing the switches 26.1 and 26.2 to switch in a manner which is completely analogous to that described with reference to FIG. 2. Assuming that the voltage at the output 3 of the first integrator 1 is equal to V1, a voltage which is equal to $$-V1.C3/C4 = \beta.V1$$

will be present, after a second control signal S2, at the output 8, in which C3 and C4 are the capacitances of the capacitors 28 and 10.

Figure 3:
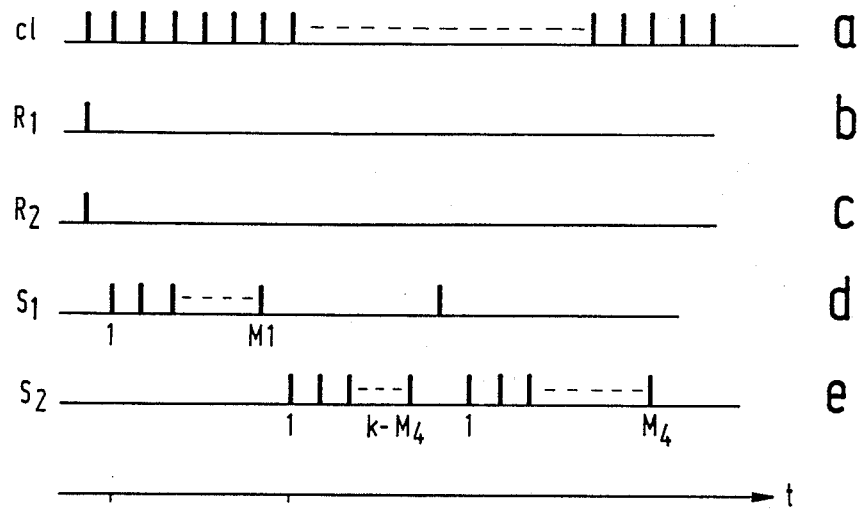
FIG. 3 shows all control signals applied to the first and the second integrating circuit during the conversion of an n-bit digital signal into an analog signal.

The operation of the converter of FIG. 1 will now be described with reference to the (control) signals of FIG. 3. FIG. 3a shows the clock pulses c1 of the clock generator 24. FIG. 3b shows the reset signal R1 which is applied to the switch 21. The capacitor 9 is discharged thereby. Under the influence of the reset signal R2, see FIG. 3c, the capacitor 10 is discharged. The reset signal R2 may also be generated at another instant, provided that this instant is before the instant when the control signal S2 is generated for the first time. Subsequently the control signal S1 is applied M1 times to the circuit 1. This is shown in FIG. 3d. Each of the pulses shown in this Figure always represents the combination of the two signals S1.1 and S1.2 between the instants $t_O$ and $t_O+T$ of FIG. 2. The result is that after these M1 control signals S1 a voltage which is equal to $$M1.\alpha.Vref$$

is present at the output 7. Subsequently M2 (=k-M4) control signals S3 are generated, see FIG. 3e. A voltage which is equal to $$M1.(k-Mr).\alpha.\beta.Vref.$$

is now produced at the output. Subsequently the control signal S1 is supplied M3 (=1) times, see FIG. 3d. The voltage $$(M1+1).\alpha.Vref.$$

is produced at the output 7. Finally the control signal S2 is supplied M4 times, see FIG. 3e. The voltage $$M4.(M1+1).\alpha.\beta.Vref+M1.(k-M4).\alpha.\beta.Vref$$

is then produced at the output 8. This is equal to $$M1.k+m4).\alpha.\beta.Vref, \text{ or for } k=2^p$$

$$(M1.2^p+M4).\alpha.\beta.Vref, \text{ in which } p\leq n.$$

For converting the n-bit digital signal $b_{n-1}b_{n-2}...b_pb_{p-1}b_{p-2}...b_2b_1b_0$, see FIG. 1, which is applied to the input 23 of the control unit 18, the (decimal) number LSB is to be taken for M4, corresponding to the binary number $b_{p-1}b_{p-2}...b_1b_0$, that is to say, the binary number constituted by the p least significant bits of the digital signal. For M1 the (decimal) number MSB is to be taken which corresponds to the binary number $b_{n-1}b_{n-2}...b_p$, that is to say, the binary number constituted by the n-p most significant bits of the digital signal.

It is evident that the second integrator for converting an arbitrary n-bit digital signal receives the control signal S2 a fixed number of times k. This means that the offset at the output 8 due to the offset $V_o$ at the output 7 has the same fixed value in all cases. This can be shown by means of the following calculation.

After the first integration step the output 7 conveys a voltage $$M1.\alpha.Vref + V_o.$$

After the second integration step the output 8 conveys a voltage $$(M1.\alpha.Vref + V_o).(k-Mr).\beta.$$

After the third integration step the output 7 conveys a voltage $$(M+1).\alpha.Vref + V_o.$$

After the fourth integration step this leads to a voltage at the output 8 which is equal to $$\{(M1+1).\alpha.Vref + V_o\}.M4.\beta + (M1.\alpha.Vref + V_o).(k+M4).\beta.$$

This can be reduced to $$(M1.k + M4).\alpha.\beta.Vref + k.\beta.V_o.$$

Since k is constant for an arbitrary n-bit digital signal, the offset voltage at the output 8 is also constant.

The number of clock pulses cl required to convert the n-bit digital signal is equal to $M1+1+k$, apart from the reset pulses. This number is at most equal to $2^{n-p}+2^p$, for $k=2^p$. For n being even and $p=n/2$, this number, taken at an average for all n-bit digital signals, will be lowest.

Figure 4:
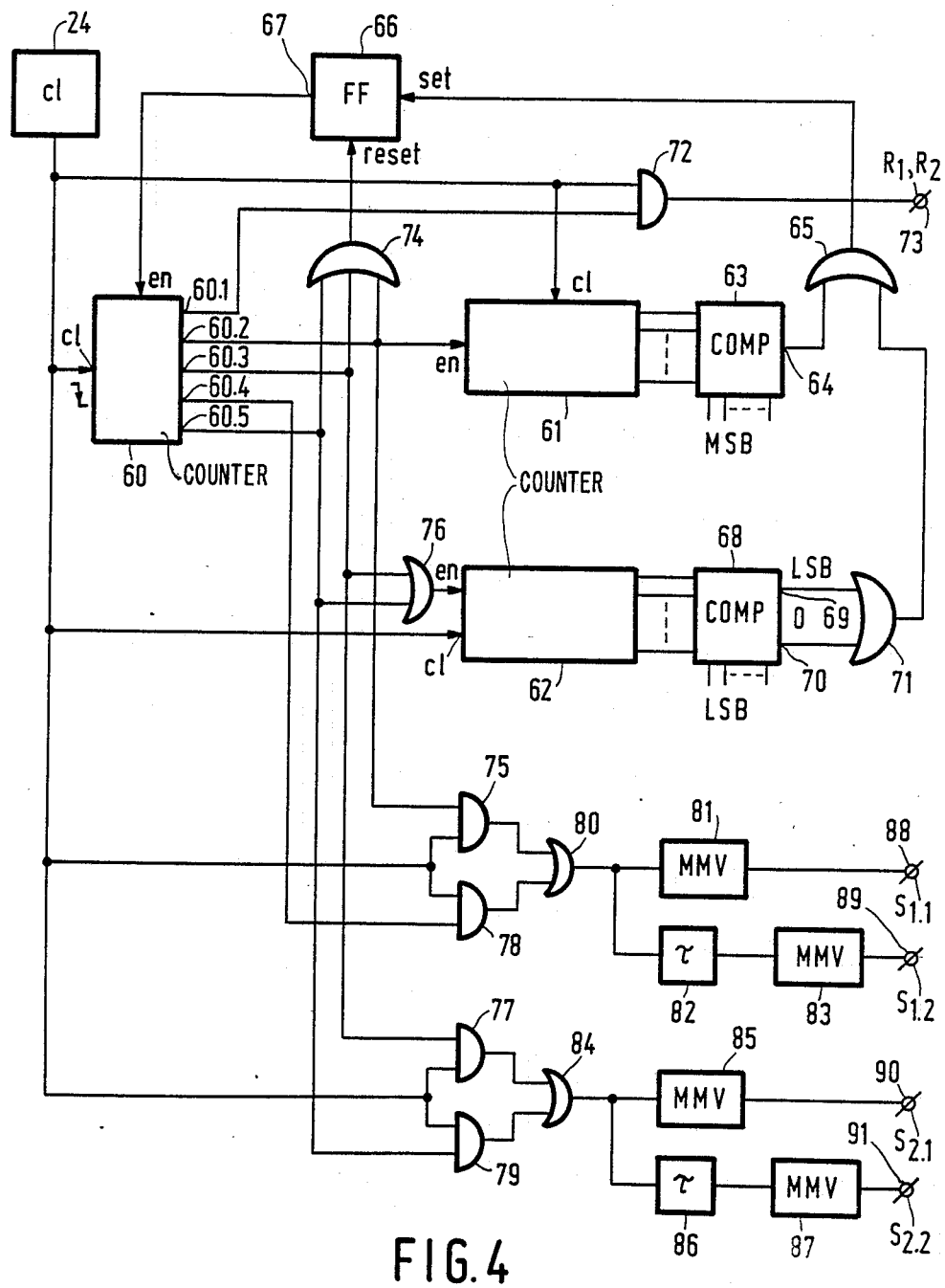
FIG. 4 shows an embodiment of the control unit in the converter of FIG. 1.

FIG. 4 shows an embodiment of the control unit 18 of FIG. 1. The clock generator 24 applies clock pulses to clock inputs cl of a 5-counter 60, of a $2^{n-p}$-counter 61 and a $2^p$-counter 62. The counter 61 counts up under the influence of the clock pulses cl. The count of the counter 61 is applied to a comparator 63 in which the count is compared with the number MSB. In the case of conformity the comparator 63 supplies a set signal at its output 64, which signal is applied via the OR-gate 65 to the set input of a flip-flop 66. The output 67 of this flip-flop is coupled to the enable input "en" of the 5-counter 60. The counter 62 counts down under the influence of the clock pulses cl. The count of the counter 62 is applied to a comparator 68 in which the count is compared with the number LSB and the number 0. In the case of conformity the comparator 68 supplies a set signal at its outputs 69 and 70, which signal is applied via the OR-gates 71 and 65 to the set input of the flip-flop 66. The output 60.1 of the counter 60 is coupled to an input of an AND-gate 62. The signal cl is applied to the other input of this AND-gate. The reset signals R1 and R2 are available at the output of the AND-gate 72. The output 60.2 of the counter 60 is coupled to the enable input "en" of the counter 61 and to inputs of an OR-gate 74 and an AND-gate 75. The output 60.3 is coupled to inputs of the OR-gates 74 and 76 and of the AND-gate 77. The output 60.4 is coupled to an input of the AND-gate 78. The output 60.5 is coupled to inputs of the AND-gate 79 and the OR-gates 74 and 76. The clock pulses cl are also applied to second inputs of the AND-gates 75, 77, 78 and 79. The outputs of the AND-gates 75 and 78 are applied via an OR-gate 80 to both a monostable multivibrator 81 and to a delay 82 which is arranged in series with another monostable multivibrator 83. The control signals S1.1 and S1.2 according to FIG. 2 are available at the outputs 88 and 89. The outputs of the AND-gates 77 and 79 are coupled via an OR-gate 84 to a monostable multivibrator 85 and a series arrangement of a delay 86 and a monostable multivibrator 87. The control signals S2.1 and S2.2 are available at the outputs 90 and 91.

The control unit operates as follows. In the initial situation the counters 61 and 62 are in the positions 0 and $2^p$ and the output 60.1 of the counter 60 is "high" (logic "1"). All other outputs of the counter 60 are "low". The flip-flop 66 is set. This means that the output 67 is "high" and the counter 60 is enabled. The first clock pulse cl is passed by the AND-gate 72. Moreover, the falling edge of this first clock pulse will cause the counter 60 to count further, which means that the output 60.1 becomes "low" and the output 60.2 becomes "high". Consequently, the AND-gate 75 is enabled and the clock pulses cl via this AND-gate 75, the OR-gate 80 and the elements 81, 82 and 83 may lead to a repeated occurrence of the first control signal S1. This is also caused by the fact the the "high" state of the output 60.2 via the OR-gate 74 results in the flip-flop 66 being reset so that the counter 60 is inhibited and thus no longer reacts to clock pulses cl. Moreover, the counter 61 is activated by the fact that the output 60.2 becomes "high". Under the influence of the clock pulses cl the counter 61 thus counts up until M1 pulses have been counted. The comparator 63 then supplies a set signal setting the flip-flop 66. At the next falling edge of a clock pulse the output 60.2 will become "low" and the output 60.3 will become "high". The AND-gate 75 is then inhibited and the AND-gate 77 is enabled. The counter 62 is also enabled. Clock pulses cl are thus passed on via the AND-gate 77, which pulses then give rise to the occurrence of the control signals S2.1 and S2.2 for a number of times. Moreover, the counter 62 counts down until the value $2^p-M4$ is reached. After $2^p-M4$ clock pulses the comparator 68 supplies a set signal at the output 69, which signal ensures that flip-flop 66 is set. At the next falling edge of a clock pulse the counter 60 will count further again. The output 60.3 becomes "low" and the output 60.4 becomes "high". The AND-gate 77 is thus inhibited and the AND-gate 78 is enabled. Under the influence of the clock pulse the control signal S1 is generated once and the counter 60 counts further. The output 60.4 becomes "low" again and the output 60.5 becomes "high". Consequently, the flip-flop 66 is reset so that the counter 60 remains insensitive to subsequent pulses. Moreover, the AND-gate 78 is inhibited, the AND-gate 79 is enabled and the counter 62 is enabled. The counter now counts M4 pulses down, whereafter a set signal is generated via the output 70 of the comparator 68. Then M4 control signals S2 have been generated, whereafter the output 60.6 becomes "low" and the output 60.1 becomes "high" at the next falling edge of a clock pulse. Thereafter the cycle is repeated again for converting a subsequent n-bit digital signal.

Figure 5:
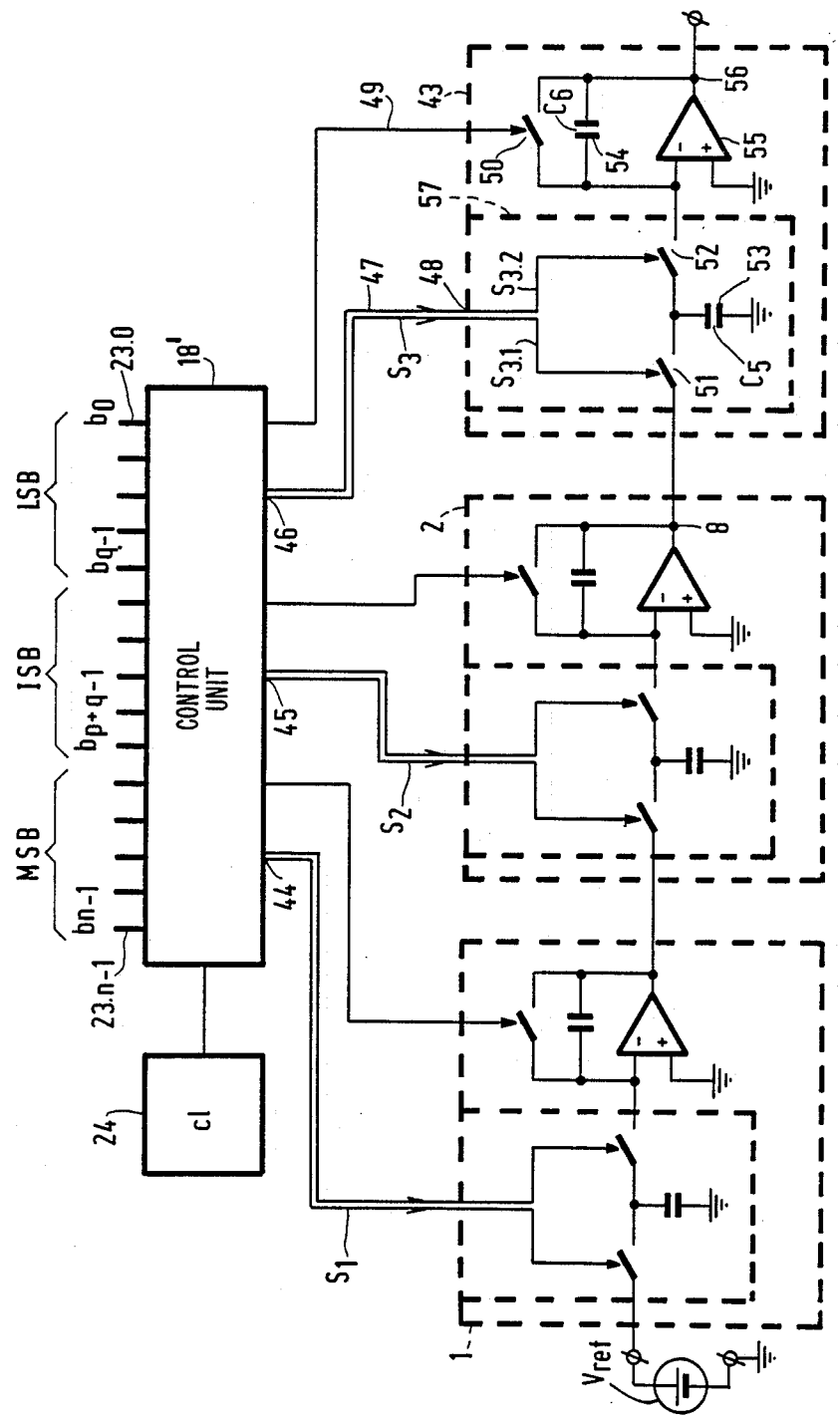
FIG. 5 shows a second embodiment of the converter comprising three integrating circuits.

FIG. 5 shows a converter comprising three series arranged integrators 1, 2 and 43. The structure of integrator 43 is identical to that of the integrators 1 and 2.

The control unit 18' supplies first, second and third control signals S1, S2 and S3 at first, second and third outputs 44, 45 and 46, respectively. The control signal S3 is applied via the lead 47 to a control signal input 48 of the integrator 43. The control signal S3 has the same form as the control signals S1 and S2 and is also composed of two sub-signals S3.1 and S3.2 which in turn are identical to the signals S1.1 and S1.2 shown in FIGS. 2b and 2c. The signal S3.1 is intended to close the switch 51 in the capacitor network 57 for a short period. The signal S3.2 controls the switch 52. The network 57 also includes the capacitor 53 having a capacitance C6. The capacitor 54 which is arranged between the inverting input (−) and the output of the amplifier stage 55 has a capacitance C6. The control unit 18' also applies reset signals R1, R2 and R3 to the integrators. The reset signal R3 is applied via the lead 49 to the switching element 50 of the integrator 43.

Figure 6:
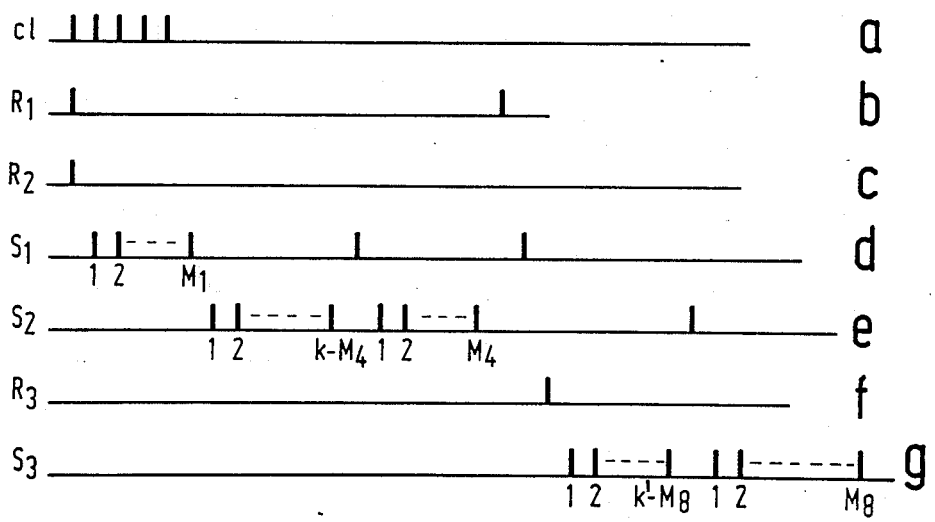
FIG. 6 shows all of the control signals applied to the three integrating circuits of FIG. 5 during the conversion of an n-bit digital signal into an analog signal.

The operation of the converter of FIG. 5 will be described with reference to FIG. 6. FIGS. 6a to 6e show control signals leading to the first four integration steps as described with reference to FIG. 3. FIG. 6f shows the reset signal R3 and FIG. 6g shows the control signal S3, all as a function of time. It is clear from FIGS. 6b to 6e that the first four integration steps are identical to the four integration steps in the converter of FIG. 1. As already noted hereinbefore, the output 8 then conveys a voltage which is equal to $$(M1.k + M4).\alpha.\beta.Vref.$$

Subsequently a reset signal R1 is generated, see FIG. 6b, whereafter the control signal S1 is applied M5 (=1) times to the integrator 1, see FIG. 6d. A voltage which is equal to $$\alpha.Vref$$

is then produced at the output 7. After discharging the capacitor 54 under the influence of the signal R3, see FIG. 6f, (note that this discharge could also have been effected at an earlier moment. For example, it could have coincided in time with the discharge of the capacitors 9 and 10 at the start of the cycle) the control unit 18' generates the control signal S3 a total of M6 (=k'-M8) times, see FIG. 6g. The voltage $$(k'-M8).\delta.(M1.k+M4).\alpha.\beta.Vref$$

then appears at the output 56. In this case the last integration step could also have been performed earlier, but after the fourth integration step. Subsequently the control unit 18' supplies the control signal S2 for M7 (=1) times, see FIG. 6e. The output 8 then conveys a voltage which is equal to $$\alpha.\beta.Vref + (M1.k+M4).\alpha.\beta.Vref.$$

After M8 times the signal S3, see FIG. 6g, the voltage at the output 56 is equal to $$M8.\delta.(1+m1.k+M4).\alpha.\beta.Vref+(k'-M8).\delta.(M1.k+M4).\alpha.\beta.Vref,$$

or is equal to $$(k.k'.M1+k'.M4+M8).\alpha.\delta.Vref$$

For $k=2^p$ and $k'=2^q$ this will be $$(M1.2^{(p+q)} + M4.2^q + M8).\alpha.\beta.\delta.Vref, \text{ in which}$$

$$+q \leq n.$$

For converting the n-bit digital signal $b_{n-1} \ldots b_0$, see FIG. 5, which is applied to the input 23 of the control unit 18', the (decimal) number LSB should be taken for M8, which corresponds to the binary number $b_{q-1} \ldots b_0$ which is constituted by the q least significant bits in the n-bit digital signal. For M1 the (decimal) number MSB should be taken which corresponds to the binary number $b_{n-1} \ldots b_{p+q}$ constituted by the n-p-q most significant bits of the digital signal. For M4 the (decimal) number ISB should be taken which corresponds to the binary number $b_{p+q-1} \ldots b_q$ constituted by the remaining p bits.

If the offset $k.\beta.V_o$ present after the fourth integration step at the output 8 had been included in the calculation, this offset would have given rise to an offset of $(M8+k.k').\beta.\delta.V_o$ at the output 56 after the eighth integration step. Only the term $M8.\beta.\delta.V_o$ is dependent on the value of the n-bit digital signal. $\beta$ and $\delta$ are both generally smaller than 1 and are preferably equal to $1/k'$ or $2^{-q}$ and $1/k$ or $2^{-p}$, respectively. Thus, for the largest possible n-bit digital signal an output signal is obtained in each stage which is equal in amplitude to the input signal of the same stage. Thus this means that the term $M8.\beta.\delta.V_o$ contributes to a very small extent to the total offset signal at the output 56.

The number of clock pulses required for converting an n-bit digital signal is approximately equal to $M1+k+k'$ in the threestage converter. In the maximum case this is $2^p + 2^q + 2^{(n-p-q)}$. For n which is divisible by 3 and $p=q=n/3$ this number, taken at an average, is lowest. Moreover, the three-stage converter will generally, and at a sufficiently large value for n, need fewer clock pulses than the two-stage converter so that a faster conversion can be realized.

It will be evident that the control unit 18' in FIG. 5 may have a structure which is identical to that of the control unit 18 described with reference to FIG. 4. For designing a circuit for the control unit 18' it is thus not necessary to use knowledge beyond that of those skilled in the art, i.e., the only knowledge required is that logically following from the obvious extension of the control unit for a two-stage converter to a control unit for a three-stage converter.

It is to be noted that the invention is not limited to the converters according to the embodiments shown. The invention can also be used for embodiments differing as to elements not relating to the invention.

What is claimed is:

1. A digital-to-analog converter for converting a digital signal having a word length n into an analog signal, comprising a series arrangement of a first and a second integrating circuit each having an input an output and a control signal input, the output of the first integrating circuit being coupled to the input of the second integrating circuit, a control unit for supplying a first and a second control signal at a first and a second output, respectively, coupled to the control signal input of the first and the second integrating circuit, respectively, for applying the first and the second control signal to the first and the second integrating circuit, respectively, the first and the second integrating circuit being adapted to perform an integration step under the influence of the first and the second control signal, respectively, and the control unit being adapted to generate, in this order, the first control signal M1 times, the second control signal M2 times, the first control signal M3 times and the second control signal M4 times, characterized in that M2+M4 is equal to a constant (k) for converting arbitrary digital signals having a word length n.

2. A digital-to-analog converter as claimed in claim 1 for converting an n-bit digital signal, characterized in that the constant (k) is equal to $2^p$, in which $p \leq n$.

3. A digital-to-analog converter as claimed in claim 2, characterized in that M3=1, in that M4 is the value corresponding to the binary number formed by the p least significant bits of the n-bit digital signal and in that M1 is the value corresponding to the binary number formed by the n-p most significant bits of the n-bit digital signal.

4. A digital-to-analog converter as claimed in claim 2, characterized in that a third integrating circuit is coupled in series with the second integrating circuit, in that the third integrating circuit is adapted to perform an integration step under the influence of a third control signal applied to a control signal input of said third integrating circuit, in that the control unit is adapted to generate the third control signal at a third output which is coupled to the control signal input of the third integrating circuit and is also adapted to generate a reset signal for bringing the signal at the output of the first integrating circuit to an initial level and for generating, in this order, the first control signal M5 times, the third control signal M6 times, the second control signal M7 times and the third control signal M8 times.

5. A digital-to-analog converter as claimed in claim 4, characterized in that for converting arbitrary digital signals having a word length n, (coma) M6+M8 is equal to a constant (k').

6. A digital-to-analog converter as claimed in claim 5 for converting an n-bit digital signal, characterized in that the constant (k') is equal to $2^q$ in which $p+q \leq n$.

7. A digital-to-analog converter as claimed in claim 6, characterized in that M3=M5=M7=1, in that M8 is the value corresponding to the binary number constituted by the q least significant bits of the n-bit digital signal, M1 is the value corresponding to the binary number constituted by the n-p-q most significant bits and M4 is the value corresponding to the binary number constituted by the remaining p bits of the n-bit digital signal.

8. A digital-to-analog converter as claimed in claim 2, characterized in that n is an even number and p=n/2.

9. A digital-to-analog converter as claimed in claim 4, characterized in that n is a number which is divisible by 3 and p=q=n/3.

10. A digital-to-analog converter as claimed in claim 1 wherein each integrating circuit comprises a switched capacitor integrator comprising an amplifier stage with an inverting and a non-inverting input and an output, a capacitor coupled between the inverting input and the output and a capacitor network comprising at least one switching element and coupled between the input of the integrator and the inverting input of the amplifier stage, said capacitor network having a control signal input for receiving one of said control signals for causing the switching element to switch under the influence of the control signal.

11. A digital-to-analog converter as claimed in claim 10, further comprising another switching element connected in parallel with the capacitor and coupled between the inverting input and the output of the amplifier stage, and wherein the other switching element has a control signal input for receiving a reset signal from the control unit.

12. A digital-to-analog converter as claimed in claim 1, characterized in that a third integrating circuit is coupled in series with the second integrating circuit, in that the third integrating circuit is adapted to perform an integration step under the influence of a third control signal applied to a control signal input of said third integrating circuit, in that the control unit is adapted to generate the third control signal at a third output which is coupled to the control signal input of the third integrating circuit and is also adapted to generate a reset signal for bringing the signal at the output of the first integrating circuit to an initial level and for generating, in this order, the first control signal M5 times, the third control signal M6 times, the second control signal M7 times and the third control signal M8 times.

13. A digital-to-analog converter as claimed in claim 12, characterized in that for converting arbitrary digital signals having a word length n, M6+M8 is equal to a constant (k').

14. A digital-to-analog converter as claimed in claim 3, characterized in that n is an even number and p=n/2.

15. A digital-to-analog converter as claimed in claim 6, characterized in that n is a number which is divisible by 3 and p=q=n/3.

16. A digital-to-analog converter as claimed in claim 13 for converting an n-bit digital signal, characterized in that the constant (k') is equal to $2^q$ in which $p+q \leq n$.

17. A digital-to-analog converter as claimed in claim 16, wherein M3=M5=M7=1.

* * * * *